June 27, 1961 S. D. HUGHES ET AL 2,990,533

TERMINAL POST FOR CIRCUIT BOARD

Filed April 9, 1958

Stokes D. Hughes
Harry W. Barner

INVENTORS

BY Clarence A. O'Brien
and Harvey B. Jacobson
Attorneys

United States Patent Office 2,990,533

Patented June 27, 1961

2,990,533

TERMINAL POST FOR CIRCUIT BOARD

Stokes D. Hughes, 8721 Rindge Ave., Playa Del Rey, Calif., and Harry W. Barner, 8400 Vicksburg Ave., Los Angeles, Calif.

Filed Apr. 9, 1958, Ser. No. 727,450
3 Claims. (Cl. 339—17)

This invention relates to printed circuitry and more particularly to a terminal post for a circuit board.

It is a current practice to provide a terminal post for a circuit board, that has very little area to grip around the top of a plated hole in the board. In addition, when electroplating straight-through holes in circuit boards, the holes tend to plate heavier near the top and bottom of the hole thereby leaving a barrel effect which prevents the shank of the solder terminal from making good electrical or mechanical contact with the side walls of the hole.

An object of this invention is to provide an improved terminal post that has a shank adapted to pass through a specially designed hole. The hole has a tapered part and the shank has an integral collar which is also tapered to match the taper of the hole. Therefore the terminal post can be mechanically anchored without even soldering by simply wedging the integral collar in the tapered part of the hole in the terminal board. Of course, should soldering be desired, a copious soldering area is provided for.

By having a hole in the circuit board in this shape, it electroplates much more uniformly on the inner surface of the tapered part than a straight through hole. Since the terminal constructed in accordance with this invention grips the electroplating in the bored hole much more firmly, the possibility of the circuit conductors becoming loose or raised from the board by heat from soldering is eliminated.

The terminal post of this invention has the tapered collar formed with serrations, flutes, small ribs, etc. to more firmly grip into the metal with which the hole is electroplated. This makes for much greater electrical contact as well as mechanical gripping since a much greater area of the terminal post is in contact with the conductive material with which the hole is plated. The hole, being tapered, provides much greater mechanical strength against loosening.

The invention provides a terminal post which is both superior and more economical than terminal posts that are currently used for circuit boards of the type commonly known as printed circuit boards or panels.

These together with other objects and advantages which will become subsequently apparent reside in the details of construction and operation as more fully hereinafter described and claimed, reference being had to the accompanying drawings forming a part hereof, wherein like numerals refer to like parts throughout, and in which:

Figure 1:
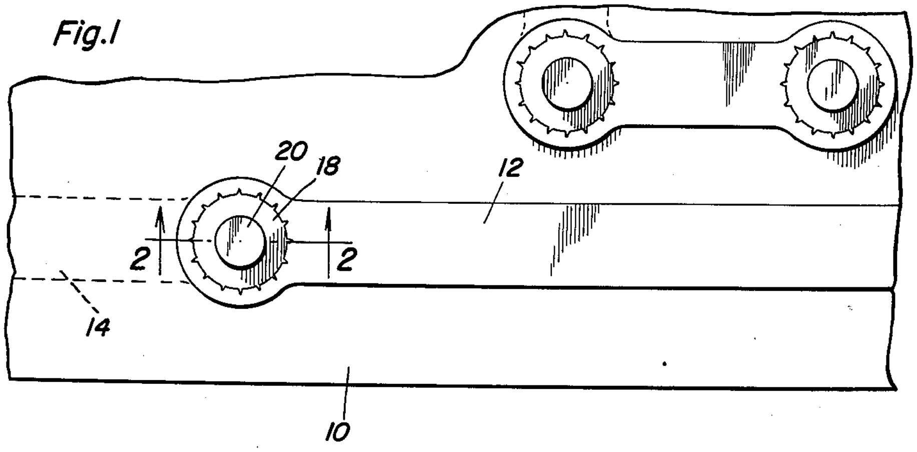
FIGURE 1 is a fragmentary top view of a typical circuit board having a number of terminal posts of the invention applied thereto.
Figure 2:
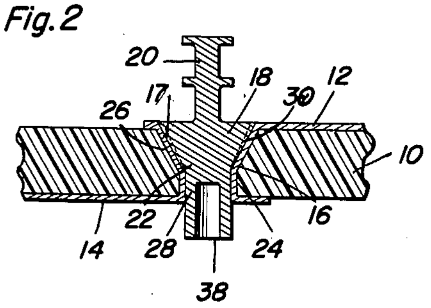
FIGURE 2 is a sectional view through one of the terminal posts and taken on the line 2—2 of FIGURE 1.
Figure 3:
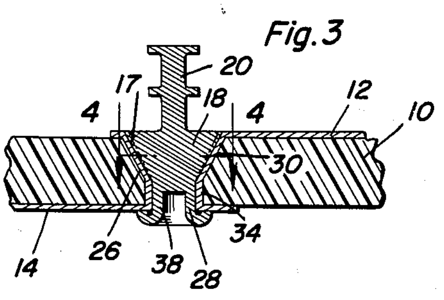
FIGURE 3 is a sectional view of the terminal post in FIGURE 2 but showing the post completely fastened in place.
Figure 5:
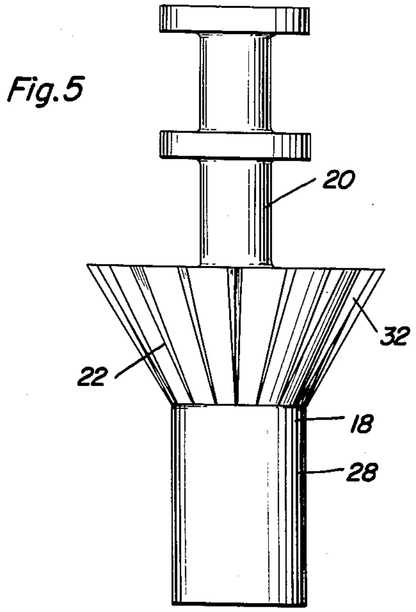
FIGURE 5 is a greatly enlarged elevational view of a terminal post in accordance with the invention.

In FIGURE 1 a typical circuit board 10 is fragmentarily illustrated. The circuit board is the type which has a circuit conductor formation 12 on one surface and another circuit conductor formation 14 on the other surface thereof. A through hole or aperture 16 is in the board 10 and has a conductor 17 forming a conductive liner on its walls which functions to connect the circuit conductor formation 12 with the circuit conductor formation 14. Ordinarily such holes are drilled, punched, etc. and have a uniform diameter bore. Thereafter the holes are electroplated and as a result there is a build-up of electroplating material near the surfaces of the board. Close inspection of an ordinary through hole in a circuit board will show that it is barrel-shaped and therefore ordinary terminals make a firm contact near the surfaces of the board only.

Terminal post 18 in accordance with the invention has an upper part or binding post 20 together with a shank 22 which fits in the aperture 16. The aperture has a cylindrical portion 24 and a tapered portion 26 which is in the form of a truncated cone. The shank 22 of terminal post 18 is constructed to match the shape of tapered portion 26 and therefore it has a cylindrical portion 28 and a portion 30 in the shape of a truncated cone and coaxial with portion 26. Portion 30 can be considered as an integral collar since it protrudes laterally from the surface of portion 28.

Figure 4:
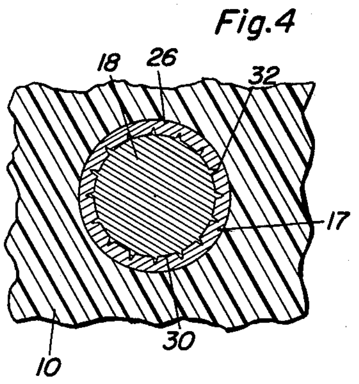
FIGURE 4 is a cross sectional view taken on the line 4—4 of FIGURE 3.

There are knurlings, ribs, serrations or like surface markings 32 on the outer surface of the integral collar 30 and these bite into the lining material of the aperture 16, which can be electroplated thereon. However in electroplating the sloping surfaces of portion 26, there is no undesired build-up of material at one surface of the board 10 and therefore a much better grip can be achieved for both mechanical connection and electrical continuity involving the post 18 and the circuit conductor formations 12 and 14. As shown in FIGURE 4 when the post 18 is driven in place within the aperture 16, the knurlings, ribs, scoring, serrations, etc. actually bite into the material of the liner and seat firmly therein. This prevents a rotation of the post as well as makes an over-all better mechanical and electrical connection.

The end 38 of the shank has an opening within which to accept a tool for peening over or otherwise spreading the end of the shank so that it is turned onto the circuit formation adjacent to the aperture 16.

In use, the terminal post is put to the same service as conventional terminal posts. However it is more inexpensive to produce in that it can be applied much easier and much faster than ordinary terminal posts and it does a better job from an electrical continuity, endurance and mechanical connection standpoint.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention as claimed.

What is claimed as new is as follows:

1. In a circuit board that has elongated flat circuit conductor formations on both surfaces thereof and an aperture through both of said formations and board, an electrically conductive liner in said aperture and connected with said formations, a solid terminal post that has a shank with an integral coaxial collar intermediate its ends, said collar disposed within said aperture and having an outer surface provided with means gripping into the material of the liner when the integral collar is wedged into said aperture, said aperture and conductive liner having a tapered portion and a cylindrical portion axially aligned therewith, and said terminal post having a cylindrical portion coaxial with said integral collar and adapted to fit in the cylindrical portion of said liner.

2. In combination with a circuit board that has a conductive pattern of electrical conductors on one surface thereof and an aperture in one of said conductors and in the board, at least a portion of said aperture having a tapered side wall, a terminal post having a shank of approximately cylindrical shape, a coaxial truncated conical portion provided with an outer surface on which there are surface interruptions, and said truncated conical portion and surface interruptions wedged into said tapered side wall portion of said aperture to anchor said shank.

3. The combination of claim 2, wherein there are conductive means contacting said truncated conical portion and said pattern of electrical conductors at said aperture.

References Cited in the file of this patent

UNITED STATES PATENTS

| | | |
|---|---|---|
| 1,578,667 | Kelsay | Mar. 30, 1926 |
| 1,627,442 | Luthy | May 3, 1927 |
| 1,786,369 | Terrell et al. | Dec. 23, 1930 |
| 2,547,866 | Hingelberg | Apr. 3, 1951 |
| 2,593,479 | Nieter | Apr. 22, 1952 |
| 2,811,702 | Narozny | Oct. 29, 1957 |

FOREIGN PATENTS

| | | |
|---|---|---|
| 1,154,541 | France | Nov. 4, 1957 |